(12) United States Patent
Kim et al.

(10) Patent No.: US 9,337,849 B2
(45) Date of Patent: May 10, 2016

(54) PHASE DETECTOR, PHASE-FREQUENCY DETECTOR, AND DIGITAL PHASE LOCKED LOOP

(71) Applicants: SK HYNIX INC., Icheon (KR); INDUSTRY-UNIVERSITY COOPERATION FOUNDATION HANYANG UNIVERSITY, Seoul (KR)

(72) Inventors: Young-Hoon Kim, Gwangmyeong (KR); Soo-Young Jang, Seoul (KR); Chang-Sik Yoo, Seoul (KR); Chun-Seok Jeong, Seoul (KR); Kang-Seol Lee, Seoul (KR)

(73) Assignees: SK HYNIX INC., Icheon (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 14/325,055

(22) Filed: Jul. 7, 2014

(65) Prior Publication Data
US 2015/0008961 A1 Jan. 8, 2015

(30) Foreign Application Priority Data

Jul. 8, 2013 (KR) .......................... 10-2013-0079411
Jun. 19, 2014 (KR) .......................... 10-2014-0074821

(51) Int. Cl.
*H03L 7/08* (2006.01)
*H03L 7/085* (2006.01)

(52) U.S. Cl.
CPC .................................... *H03L 7/085* (2013.01)

(58) Field of Classification Search
CPC ............... H03L 7/10; H03L 7/18; H03L 7/09; H03L 7/099; H03L 7/091; H03L 7/07
USPC ........................ 327/2, 12, 156, 158
See application file for complete search history.

(56) References Cited

U.S. PATENT DOCUMENTS

| | | | |
|---|---|---|---|
| 6,265,903 B1 * | 7/2001 | Takahashi | 327/7 |
| 7,986,176 B2 * | 7/2011 | Kanayama | 327/156 |
| 2010/0123488 A1 | 5/2010 | Palmer et al. | |
| 2014/0077841 A1 * | 3/2014 | Jia | G04F 10/005 327/3 |

OTHER PUBLICATIONS

A. Rylyakov et al., "Bang-Bang Digital PLLs at 11 and 20GHz with sub-200fs Integrated Jitter for High-Speed Serial Communication Applications", 2009 IEEE International Solid-State Circuits Conference, ISSCC 2009/SESSION5, 2009, IEEE.

* cited by examiner

*Primary Examiner* — John Poos

(57) ABSTRACT

A phase detector includes a phase comparing circuit configured to detect and output a phase difference between a first clock signal and a second clock signal, a latch circuit configured to latch an output signal of the phase comparing circuit and output a phase detection signal, and an initial voltage control circuit configured to control an initial voltage of an input terminal of the latch circuit according to a control signal.

16 Claims, 17 Drawing Sheets

<Prior Art>

<Prior Art>

<Prior Art>

<Prior Art>

PHASE DETECTOR, PHASE-FREQUENCY DETECTOR, AND DIGITAL PHASE LOCKED LOOP

CROSS-REFERENCES TO RELATED APPLICATION

The present application claims priority under 35 U.S.C. §119(a) to Korean Patent Application Number 10-2013-0079411, filed on Jul. 8, 2013 and Korean Patent Application Number 10-2014-0074821, filed on Jun. 19, 2014, in the Korean intellectual Property Office, which is incorporated herein by reference in its entirety.

BACKGROUND

1. Technical Field

Embodiments relate to a phase detector, a phase-frequency detector, and a digital phase locked loop, and more particularly, to a phase detector and a phase-frequency detector in which output timing is controlled according to a control signal and a digital phase locked loop including the same.

2. Related Art

Research has been conducted to develop a digital phase locked loop for use in place of an analog phase locked loop. A conventional digital phase locked loop (DPLL) may include a time digital converter (TDC). A bang-bang type phase detector may be used to reduce power consumption.

Because the bang-bang type phase detector has a nonlinear gain characteristic, the gain of the bang-bang type phase detector is likely to change according to a jitter of an inputted reference clock signal. As a result, the bandwidth of the entire phase locked loop is likely to change.

FIG. 1a shows a conventional DPLL 1. The conventional DPLL 1 includes a bang-bang type phase detector (BB-PD) 20, a filter 40, a digital control oscillator (DCO) 50, and a feedback circuit 60.

The conventional DPLL 1 using the BB-PD 20 includes an initialization circuit (not shown) to determine an initial frequency of an output signal of the DCO 50, and the initialization circuit provides an initialization signal init to the DCO 50. The initial frequency of the output signal of the DCO 50 may be similar to a frequency of a reference clock signal Clk_ref which is inputted for locking.

The conventional DPLL 1 further includes a delay controller 10 and a delay line 70 and thereby controls the addition of jitter to the reference clock signal Clk_ref, whereby the gain of the BB-PD 20 may be controlled and the bandwidth of the DPLL 1 may be maintained. The delay controller 10 outputs a control signal dcon according to the reference clock signal Clk_ref and a delay control signal DCS, thereby controlling the delay of the delay line 70.

FIG. 1b is a block diagram showing the BB-PD 20 of FIG. 1a. The conventional BB-PD 20 uses a D-type flip-flop (DFF) to determine the lead and lag of the reference clock signal Clk_ref relative to a feedback frequency signal Clk_fb.

FIG. 2a shows a conventional DPLL 1' which uses a bang-bang type phase-frequency detector (BB-PFD) 30 instead of the BB-PD 20 shown in FIG. 1a. Unlike the conventional DPLL 1 that uses the BB-PD 20, the conventional DPLL 1' which uses the BB-PFD 30 does not need an initialization circuit for setting an initial frequency of a DCO 50'. However, the operational principle of the conventional DPLL 1' is substantially the same as that of the conventional DPLL 1 shown in FIG. 1a.

FIG. 2b shows the detailed structure of the BB-PFD 30 of FIG. 2a. The BB-PFD 30 uses a D-type flip-flop 20 to determine the lead and the lag of a reference clock signal Clk_ref' relative to the feedback frequency signal Clk_fb.

Because each of the conventional DPLLs 1 and 1' uses the delay line 70 to add jitter to a reference clock signal in order to maintain a constant bandwidth while using the BB-PD 20 or the BB-PFD 30, a circuit area and power consumption are increased due to the presence of the delay line 70.

SUMMARY

Embodiments are directed to a BB-PD and a BB-PFD, in which output timing of a phase detection signal is controlled according to a control signal, and a DPLL including the same.

In an embodiment of the present disclosure, a phase detector includes: a phase comparing circuit configured to detect and output a phase difference between a first clock signal and a second clock signal; a latch circuit configured to latch an output signal of the phase comparing circuit; and an initial voltage control circuit configured to control an initial voltage of an input terminal of the latch circuit according to a control signal.

The latch circuit includes a first input terminal and a second input terminal, wherein the initial voltage control circuit includes a first voltage control subcircuit which controls the first input terminal and a second voltage control subcircuit which controls the second input terminal.

The first voltage control subcircuit and the second voltage control subcircuit divide a power supply voltage in response to the control signal, and control initial voltages of the first input terminal and the second input terminal, respectively.

The phase comparing circuit first discharges one of the first input terminal and the second input terminal according to the phase is difference between the first clock signal and the second clock signal.

In an embodiment of the present disclosure, a digital phase locked loop includes: an offset controller configured to dither an offset control signal and output a control signal; a phase detector configured to detect a phase difference between a first clock signal and a second clock signal according to the control signal and output a phase detection signal; a filter configured to filter the phase detection signal; a digital oscillator configured to generate a third clock signal based on an output of the filter wherein an initial frequency of the third clock signal is controlled according to an initialization signal; and a feedback circuit configured to divide the third clock signal and generate the second clock signal.

In an embodiment of the present disclosure, a phase-frequency detector includes: a first flip-flop configured to latch a power supply voltage according to a first clock signal and output a first internal clock signal; a second flip-flop configured to latch the power supply voltage according to a second clock signal and output a second internal clock signal; a reset circuit configured to logically combine the first internal clock signal and the second internal clock signal and generate a reset signal to reset the first flip-flop and the second flip-flop; a timing controller configured to generate a third internal clock signal by delaying the first internal clock signal, to generate a fourth internal clock signal by delaying the second internal clock signal and to generate a control signal by logically combining the is external control signal where the control signal is aligned with the fourth internal clock signal; and a phase detector configured to detect a phase difference between the third internal clock signal and the fourth internal clock signal according to the control signal, and output a phase detection signal.

In an embodiment of the present disclosure, a digital phase locked loop includes: a phase-frequency detector configured to detect differences in phases and frequencies between a first clock signal and a second clock signal according to an external control signal, and output a phase-frequency detection signal; an offset controller configured to dither an offset control signal and output the external control signal according to the second clock signal; a filter configured to filter the phase detection signal; a digital oscillator configured to generate a third clock signal based on an output of the filter; and a feedback circuit configured to divide the third clock signal and generate the second clock signal.

In an embodiment of the present disclosure, the phase-frequency detector may comprise a first flip-flop configured to latch a power supply voltage according to the first clock signal and output a first internal clock signal; a second flip-flop configured to latch the power supply voltage according to the second clock signal and output a second internal clock signal; a reset circuit configured to logically combine the first internal clock signal and the second internal clock signal and to generate a reset signal to reset the first flip-flop and the second flip-flop; a timing controller configured to generate a third internal clock signal by delaying the first internal clock signal, to generate a fourth internal clock signal by delaying the second internal clock signal and to generate a control signal by logically combining the external control signal where the control signal is aligned with the fourth internal clock signal; and a phase detector configured to detect a phase difference between the third internal clock signal and the fourth internal clock signal according to the control signal, and output the phase-frequency detection signal.

In an embodiment of the present disclosure, the phase detector may comprise a phase comparing circuit configured to detect and output a phase difference between the third internal clock signal and the fourth internal clock signal; a latch circuit configured to latch an output signal of the phase comparing circuit and output the phase-frequency detection signal; and an initial voltage control circuit configured to control an initial voltage of an input terminal of the latch circuit according to the control signal.

In an embodiment of the present disclosure, the offset controller may comprise a sigma-delta modulator configured to dither the offset control signal and output the external control signal.

BRIEF DESCRIPTION OF THE DRAWINGS

Features, aspects, and embodiments are described in conjunction with the attached drawings, in which:

FIG. 1b is a block diagram showing the BB-PD of FIG. 1a;

FIG. 2b is a block diagram of the BB-PFD of FIG. 2a;

DETAILED DESCRIPTION

Figure 1A:
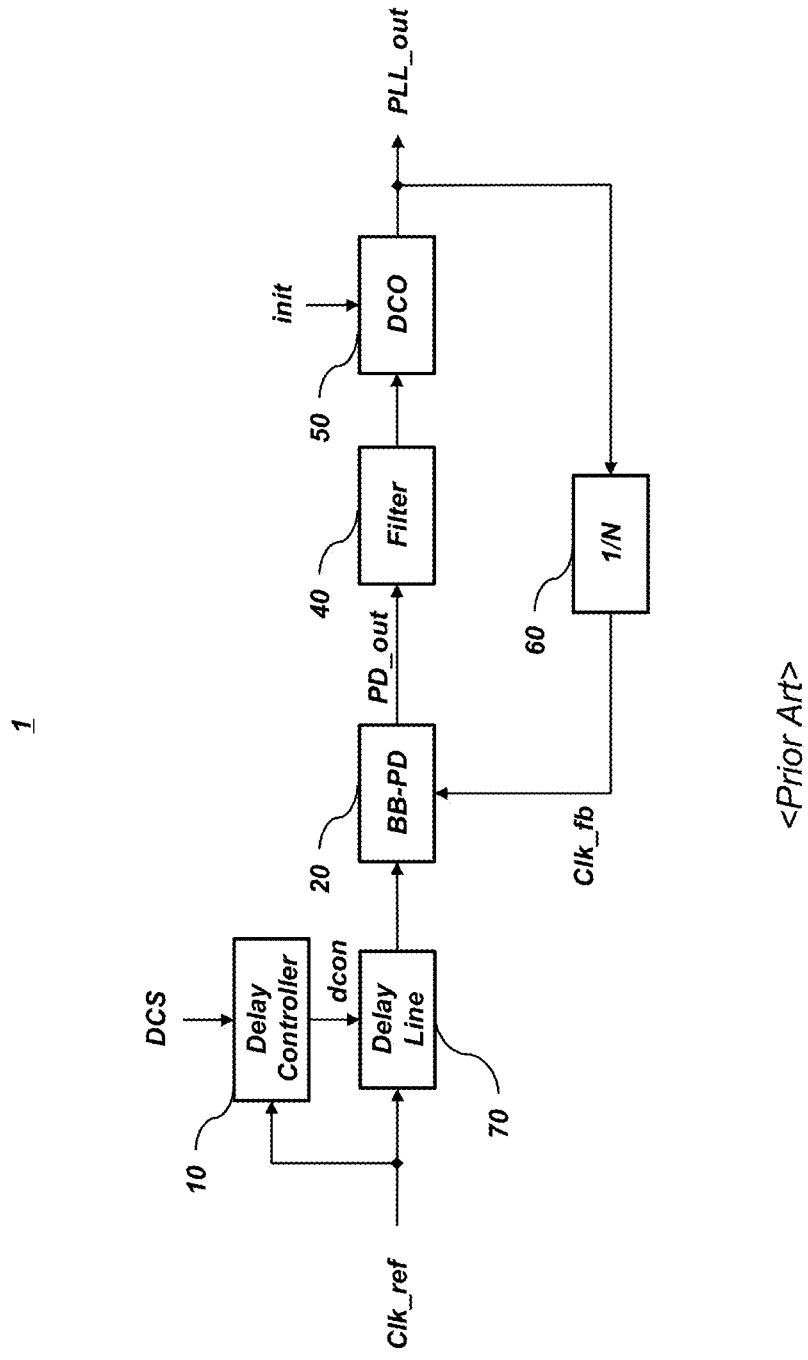
FIG. 1a is a block diagram of a conventional digital phase-locked loop (DPLL) including a bang-bang phase detector (BB-PD)
Figure 1B:
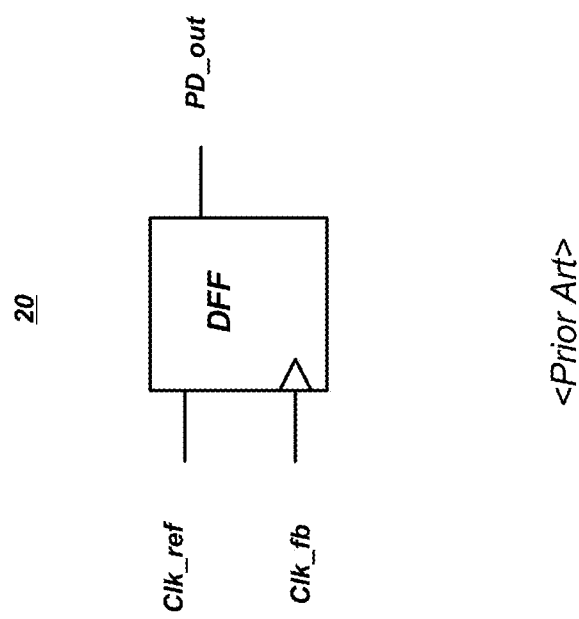
Figure 2A:
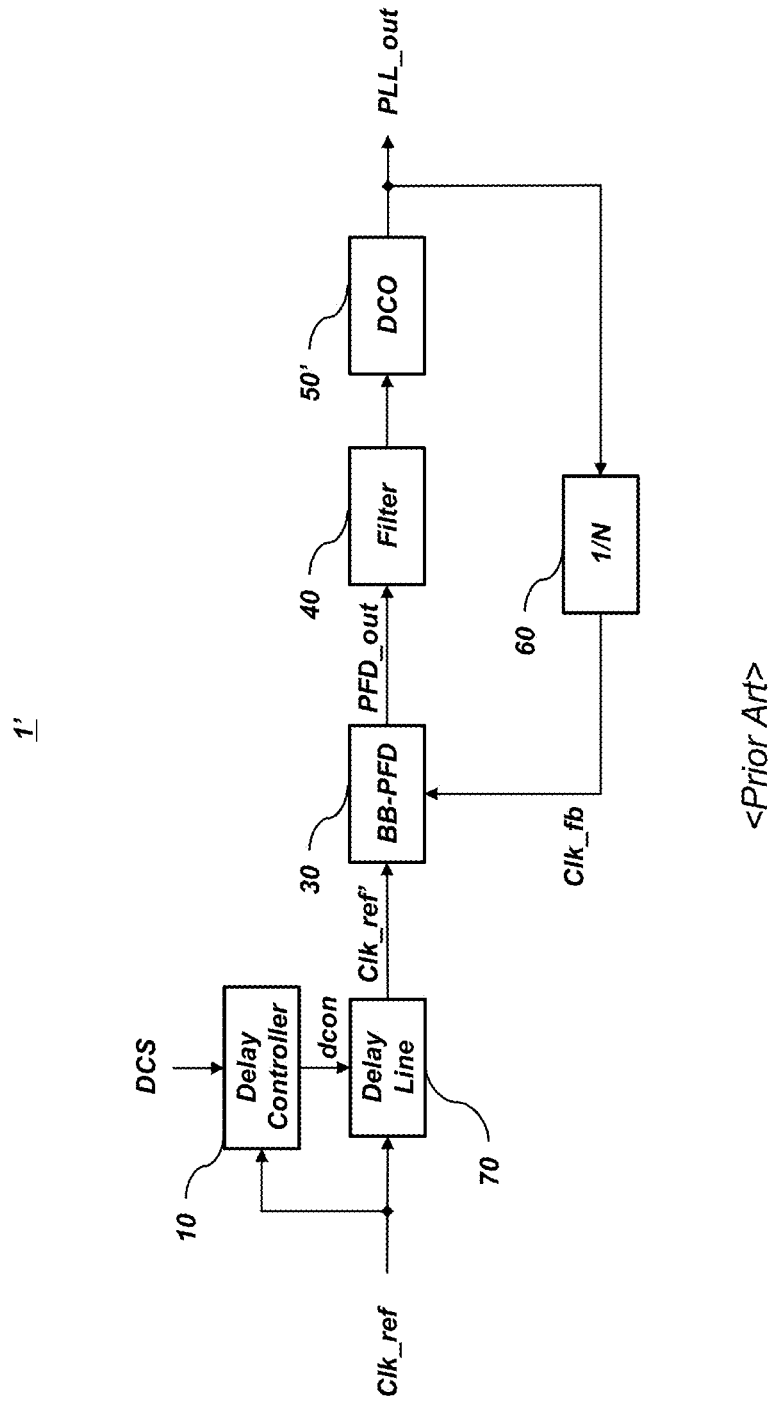
FIG. 2a is a block diagram of a conventional DPLL including a bang-bang phase-frequency detector (BB-PFD)
Figure 2B:
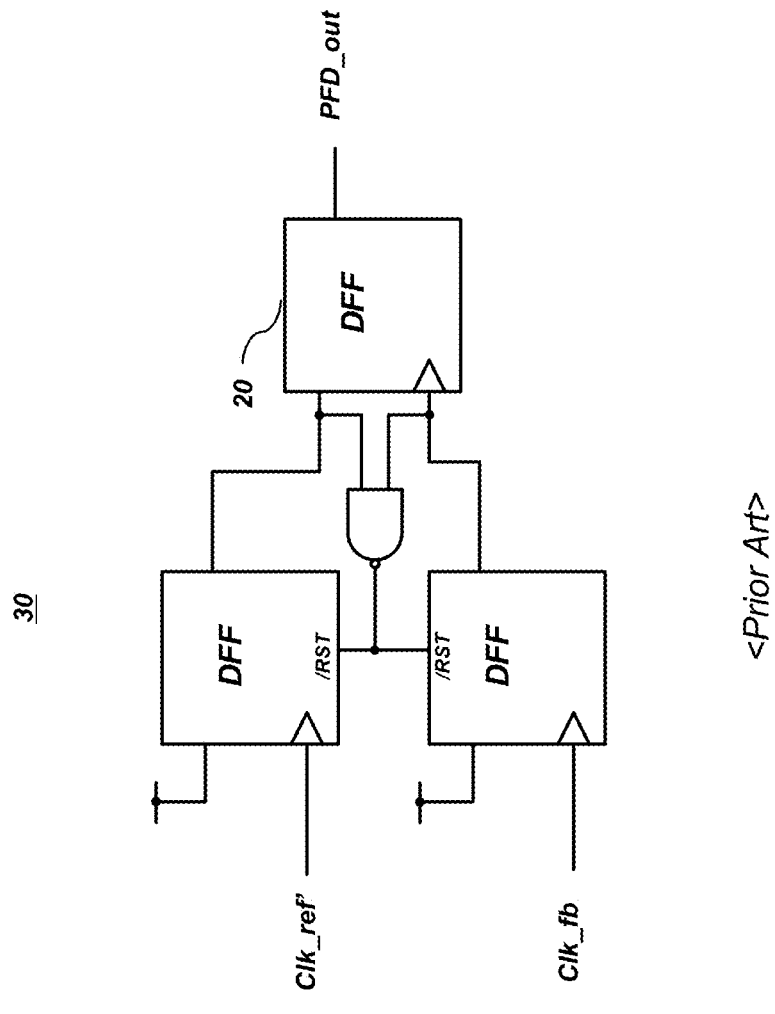

Hereinafter, embodiments of a phase detector, a phase-frequency detector, and a digital phase locked loop including the same will be described with reference to the accompanying drawings. Throughout the disclosure, identical reference numerals refer to identical parts throughout the various figures and embodiments of the present disclosure.

Figure 3:
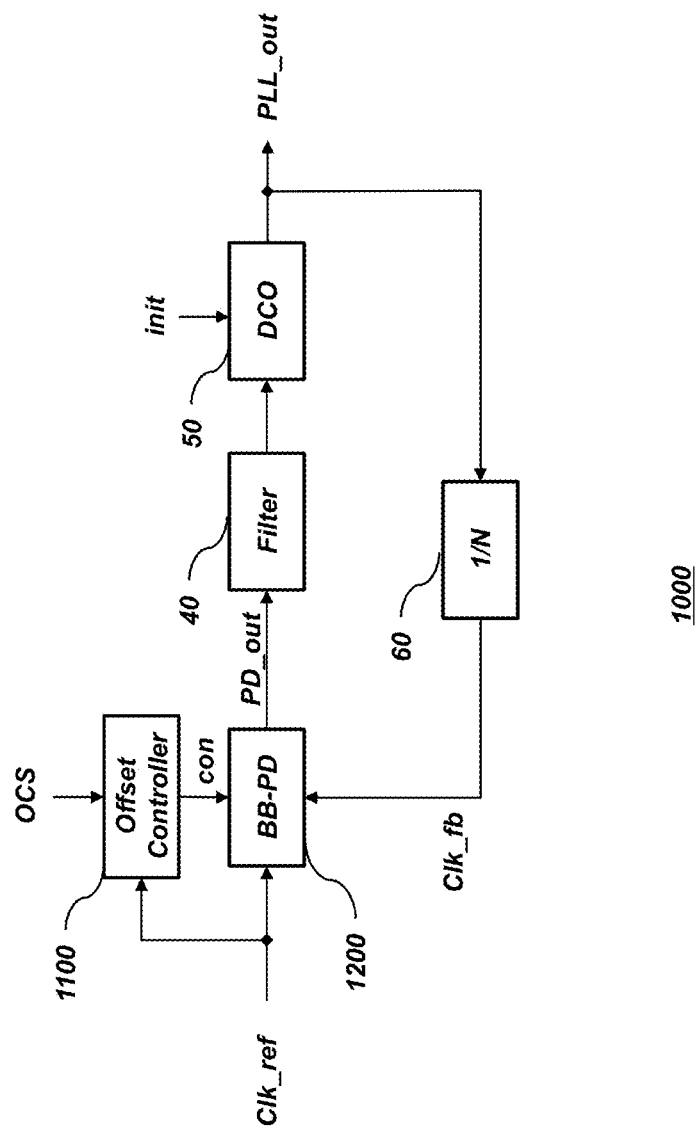
FIG. 3 is a block diagram of a DPLL in accordance with an embodiment of the present disclosure.

FIG. 3 is a block diagram of a DPLL 1000 including a BB-PD 1200 in accordance with an embodiment of the present disclosure. The DPLL 1000 includes an offset controller 1100, the BB-PD 1200, a filter 40, a DCO 50, and a feedback circuit 60. Because the filter 40, the DCO 50, and the feedback circuit 60 are, in light of the teachings and disclosures herein, generally known to those of ordinary skill in the art, detailed descriptions thereof are omitted herein.

The offset controller 1100 outputs a control signal con based on a reference clock signal Clk_ref and an offset control signal OCS. As will be described below, the control signal con includes a multi-bit digital signal which randomly changes with the passage of time.

The BB-PD 1200 determines the lead or the lag of the reference clock signal Clk_ref relative to a feedback clock signal Clk_fb provided through the feedback circuit 60, and outputs a phase detection signal PD_out to the filter 40.

The filter 40 filters the phase detection signal PD_out and outputs a filtered phase detection signal to the DCO 50. The DCO 50 generates a phase-locked clock signal PLL_out based on the filtered phase detection signal. The feedback circuit 60 divides the phase-locked clock signal PLL_out outputted from the DCO 50 and generates the feedback clock signal Clk_fb.

The BB-PD 1200 provides an effect which is similar to that of jitter being applied to the reference clock signal Clk_ref, using the control signal con outputted from the offset controller 1100. This is described in detail with reference to FIG. 5.

In the present embodiment, the offset controller 1100 may operate after the reference clock signal Clk_ref and the feedback clock signal Clk_fb are locked. That is the offset controller 1100 may be turned off before the locking and the offset controller 1100 may be turned on after the locking.

Figure 4:
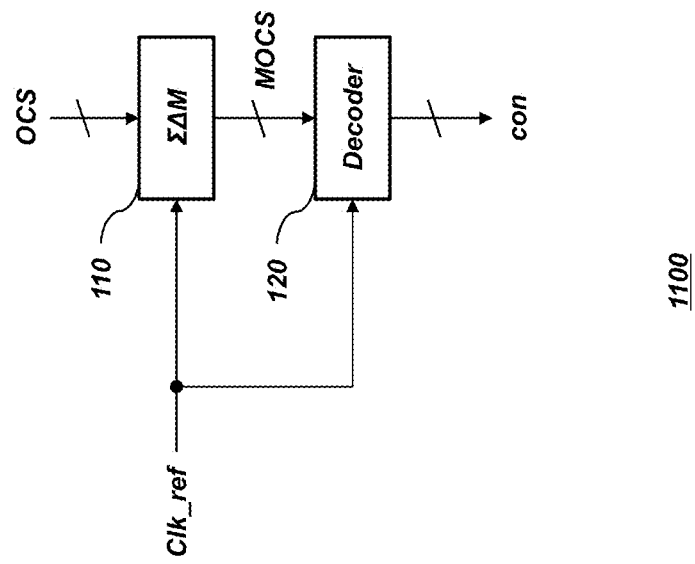
FIG. 4 is a block diagram of an offset controller of FIG. 3 in accordance with an embodiment.

FIG. 4 is a block diagram of the offset controller 1100 of FIG. 3 in accordance with an embodiment. The offset controller 1100 includes a sigma-delta modulator 110 and a decoder 120. The general configuration and operational principle of the sigma-delta modulator 110 are known to those of ordinary skill in the art.

In the present embodiment, the sigma-delta modulator 110 generates, using the reference clock signal Clk_ref, a modulation signal MOCS by sigma-delta encoding (in an embodiment, including dithering) the offset control signal OCS. The offset control signal OCS determines the amount of an offset that is artificially added to the reference clock signal Clk_ref through the BB-PD 1200. The principle of artificially applying an offset to the reference clock signal Clk_ref through the BB-PD 1200 is described below with reference to FIG. 5.

The decoder 120 decodes the modulation signal MOCS according to the reference clock signal Clk_ref and outputs the control signal con. For example, the decoder 120 may control the timing of the modulation signal MOCS according to the reference clock signal Clk_ref and logically combine the result to generate the control signal con.

The control signal con, which is disabled when the reference clock signal Clk_ref is high, may be understood to be disabled when the feedback clock signal Clk_fb is high, since the offset controller 1100 operates after the reference clock signal Clk_ref and the feedback clock signal Clk_fb are locked in the embodiment.

Each of the offset control signal OCS, the modulation signal MOCS, and the control signal con may be a multi-bit digital signal, and the number of bits of respective signals may differ according to an embodiment. In an embodiment, the modulation signal MOCS is a 2-bit digital signal, and the control signal con is a 4-bit digital signal.

Figure 5:
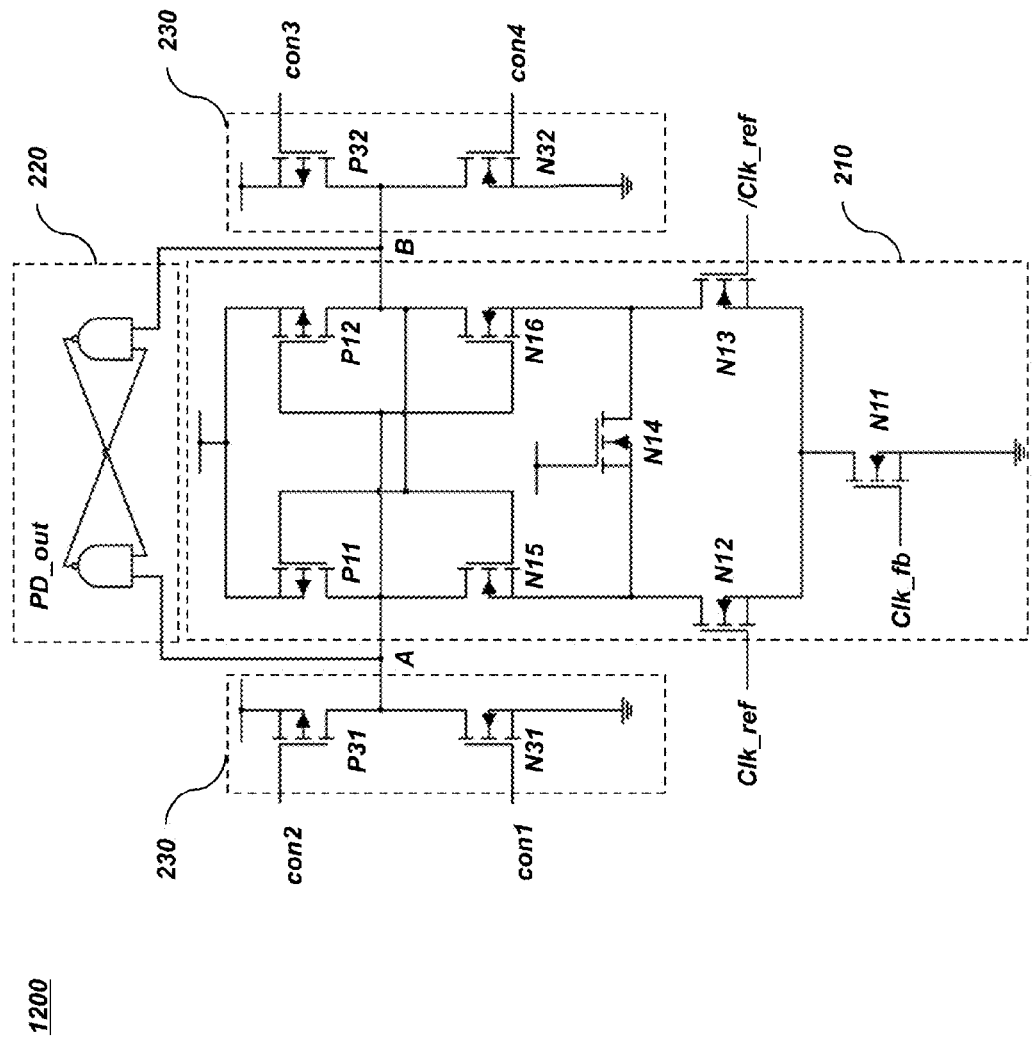
FIG. 5 is a circuit diagram of a BB-PD of FIG. 3 in accordance with an embodiment.

FIG. 5 is a circuit diagram of the BB-PD 1200 of FIG. 3 in accordance with an embodiment. The BB-PD 1200 includes a phase comparing circuit 210 which detects and outputs a phase difference between the reference clock signal Clk_ref and the feedback clock signal Clk_fb, a latch circuit 220 which latches and outputs the output signal of the phase comparing circuit 210, and an initial voltage control circuit 230 which controls initial voltages of first and second input terminals A and B of the latch circuit 220 according to first through fourth control signals con1 through con4 outputted from the offset controller 100. In an embodiment, the first through fourth control signals con1 through con4 correspond to respective bits of the control signal con, which is a 4-bit digital signal, outputted from the decoder 120 of FIG. 4.

The phase comparing circuit 210 includes a first NMOS transistor N11 having a gate to which the feedback clock signal Clk_fb is applied and a source which is grounded, second and third NMOS transistors N12 and N13 having gates to which the reference clock signal Clk_ref and an opposite phase signal /Clk_ref of the reference clock signal Clk_ref are respectively applied and sources which are electrically coupled with a drain of the first NMOS transistor N11, and a fourth NMOS transistor N14 having a gate to which a power supply voltage is applied and a source and a drain which are electrically coupled between drains of the second and third NMOS transistors N12 and N13, respectively.

The phase comparing circuit 210 also includes a first inverter, including a fifth NMOS transistor N15 and a first PMOS transistors P11, which is electrically coupled between the power supply voltage and the drain of the second NMOS transistor N12, and a second inverter, including a sixth NMOS transistor N16 and a second PMOS transistors P12, which is electrically coupled between the power supply voltage and the drain of the third NMOS transistor N13. The first inverter including the fifth NMOS transistor N15 and the first PMOS transistors P11 and the second inverter including the sixth NMOS transistor N16 and the second PMOS transistor P12 are configured as a latch with their input terminals electrically coupled with counterpart output terminals of the other inverter.

The latch circuit 220 includes two cross-coupled NAND gates, and has the first input terminal A which is electrically coupled to the output terminal of the first inverter of the phase comparing circuit 210 and the second input terminal B which is electrically coupled to the output terminal of the second inverter of the phase comparing circuit 210.

The initial voltage control circuit 230 includes a first voltage control subcircuit including a seventh NMOS transistor N31 and a third PMOS transistor P31 which are electrically coupled in series between a power supply terminal and a ground terminal to control the initial voltage of the first input terminal A. The initial voltage control circuit 230 also includes a second voltage control subcircuit including an eighth NMOS transistor N32 and a fourth PMOS transistor P32 which are electrically coupled in series between the power supply terminal and the ground terminal to control the initial voltage of the second input terminal B.

The first through fourth control signals con1 to con4 are respectively applied to gates of the seventh NMOS transistor N31, third PMOS transistor P31, fourth PMOS transistor P32, and eighth NMOS transistor N32 of the initial voltage control circuit 230. According to the levels of the first through fourth control signals con1 to con4, the first and second input terminals A and B may be initialized to values that are acquired by dividing the power supply voltage with a predetermined ratio.

As aforementioned, since the offset controller 1100 operates after the reference clock signal Clk_ref and the feedback clock signal Clk_fb are locked, the control signal con may be understood to be synchronous with the feedback clock signal Clk_fb.

In an embodiment, each of the second and third control signals con2 and con3 has the same phase as that of the feedback clock signal Clk_fb and each of the first and the fourth control signals con1 and con4 are synchronous with the feedback clock signal Clk_fb.

Accordingly, the initial voltage control circuit 230 operates when the feedback clock signal Clk_fb is low and the phase comparing circuit 210 operates when the feedback clock signal Clk_fb is high. The initial voltage control circuit 230 cuts off current paths between the first and the second input terminals A and B and the power supply and ground nodes.

When the feedback clock signal Clk_fb is low, the phase comparing circuit 210 is at an off state. Because the control signals con2 and con3, each of which has the same phase as that of the feedback clock signal Clk_fb, are also low, the third and fourth PMOS transistors P31 and P32 are turned on, and thus the first and second input terminals A and B of the latch circuit 220 are initialized to high initial voltages.

If the feedback clock signal Clk_fb then changes to a high level, the phase comparing circuit 210 is activated, and thus any one of the input terminals A and B of the latch circuit 220 will change to a low level according to the level of the reference clock signal Clk_ref at a corresponding time.

Specifically, when the reference clock signal Clk_ref has a high level at the corresponding time (that is, a phase of the reference clock signal Clk_ref is earlier than a phase of the feedback clock signal Clk_fb), the first input terminal A is discharged faster than the second input terminal B. On the other hand, when the reference clock signal Clk_ref has a low level at the corresponding time (that is, the phase of the reference clock signal Clk_ref is later than the phase of the feedback clock signal Clk_fb), the second input terminal B is discharged faster than the first input terminal A.

The latch circuit 220 generates a phase detection signal is PD_out which is latched to a set state or a reset state when the voltage level of the input terminal A or B reaches a predetermined threshold voltage. If the initial voltages of the input terminals A and B of the latch circuit 220 are changed, although the same reference clock signal Clk_ref and the same feedback clock signal Clk_fb are used, times at which the voltage levels of the input terminals A and B reach the threshold voltage are changed. As a result, a timing with which the output signal PD_out is outputted in the set state or the reset state is changed.

The change in the output timing of the BB-PD 1200 produced by differently controlling the initial voltages of the input terminals A and B of the latch circuit 220 produces a phenomenon similar to that produced in the output timing of the conventional BB-PD 20 by the reference clock signal Clk_ref having different degrees of jitter.

Because the output timing of the BB-PD 1200 is controlled by adjusting a value of the offset control signal OCS, the value of the offset control signal OCS corresponds to the amount of an offset that is applied to the reference clock signal Clk_ref. The value of the optimal offset control signal OCS which maintains the bandwidth of the DPLL 1000 regardless of the jitter of the reference clock signal Clk_ref may be determined through routine experimentation.

Figure 6:
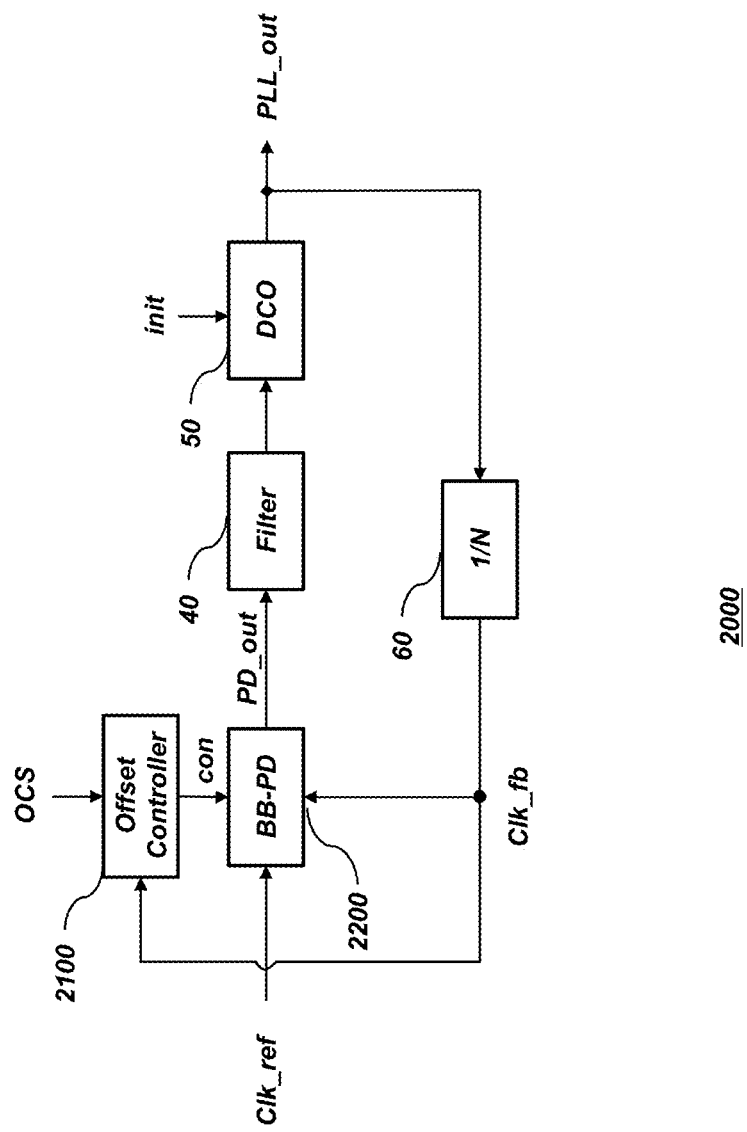
FIG. 6 is a block diagram showing a DPLL in accordance with another embodiment.

FIG. 6 is a block diagram showing a DPLL 2000 in accordance with another embodiment.

The DPLL 2000 differs from the DPLL 1000 of FIG. 3 in that the offset controller 2100 receives the feedback clock signal Clk_ref instead of the reference clock signal Clk_ref.

The offset controller 2100 of FIG. 6 may operate when the reference clock signal Clk_ref and the feedback clock signal Clk_fb are not locked while the offset controller 1100 of FIG. 3 may operate after the reference clock signal Clk_ref and the feedback clock signal Clk_fb are locked.

Figure 7:
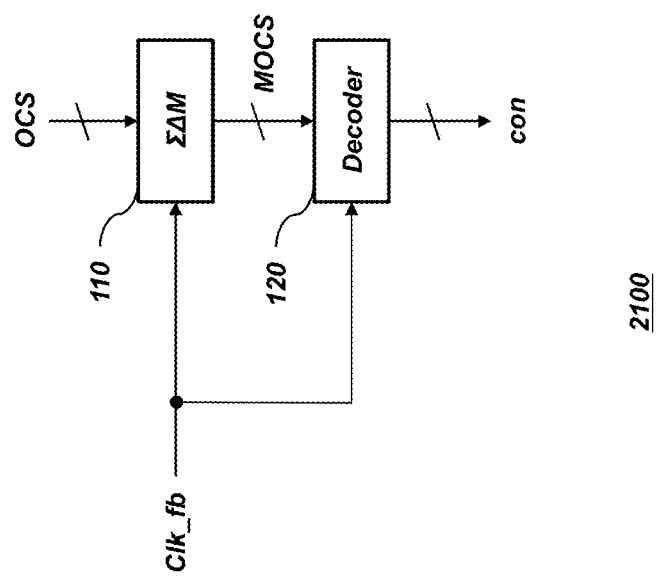
FIG. 7 is a block diagram of an offset controller of FIG. 6 in accordance with an embodiment.

FIG. 7 is a block diagram illustrating the offset controller 2100 of FIG. 6. Each of the sigma-delta modulator 110 and the decoder 120 of FIG. 7 receives the feedback clock signal Clk_fb instead of the reference clock signal Clk_ref.

The decoder 120 may generate the control signal con with the modulation signal MOCS outputted from the sigma-delta modulator 110 in synchronous with the feedback clock signal Clk_fb.

Figure 8:
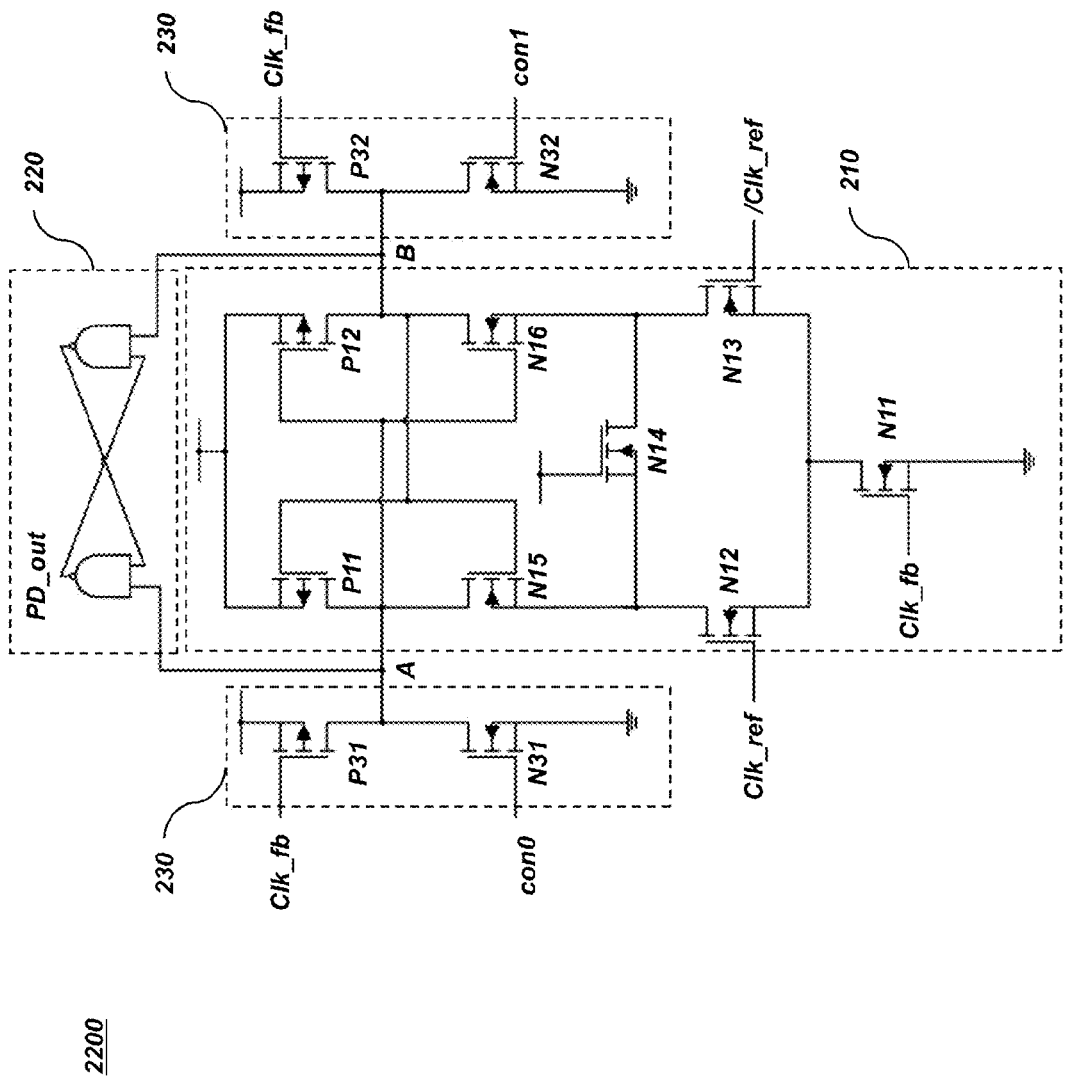
FIG. 8 is a circuit diagram of a BB-PD of FIG. 6 in accordance with an embodiment.

FIG. 8 is a circuit diagram of the BB-PD 2200 of FIG. 6.

The BB-PD 2200 of FIG. 6 is substantially as same as that in FIG. 5 except that the PMOS transistors P31 and P32 of the initial voltage control circuit 230 directly receives the feedback clock signal Clk_fb at their gates and the NMOS transistors N31 and N32 of the initial voltage control circuit 230 receives the control signals con1 and con2 at their gates.

The decoder 120 in FIG. 7 generates 2-bit control signal con with 2-bit modulation signal MOCS output from the sigma-delta modulator 110 in synchronous with the feedback clock signal Clk_fb.

Operations of the phase comparing circuit 210, the latch circuit 220 and the initial voltage control circuit 230 are substantially as same as described above and descriptions thereof are therefore omitted.

Figure 9:
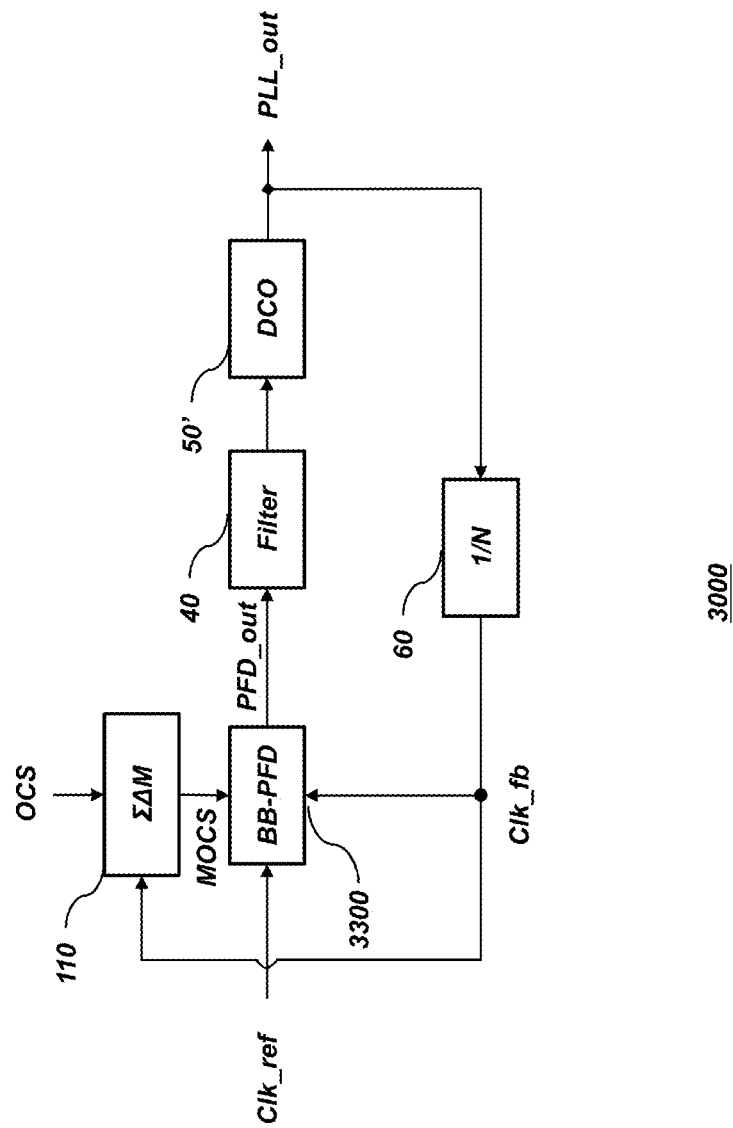
FIG. 9 is a block diagram showing a DPLL in accordance with another embodiment.

FIG. 9 is a block diagram showing a DPLL 3000 in accordance with another embodiment.

The DPLL 3000 differs from the DPLL 2000 of FIG. 6 in that the DPLL 3000 includes BB-PFD 3300 instead of BB-PD and includes DCO 50'. When using the BB-PFD 3300 instead of the BB-PD, a DCO 50' does not use an external circuit for initial frequency setting.

The DPLL 3000 includes the sigma-delta modulator 110 and does not include a decoder 120. Therefore the DPLL 3000 may further include a timing controller configured to control timings of the signals output from the sigma-delta modulator 110.

Operations of a filter 40 and a feedback circuit 60 are substantially as same as described above in the embodiment of FIG. 3, and descriptions thereof are therefore omitted.

Figure 10:
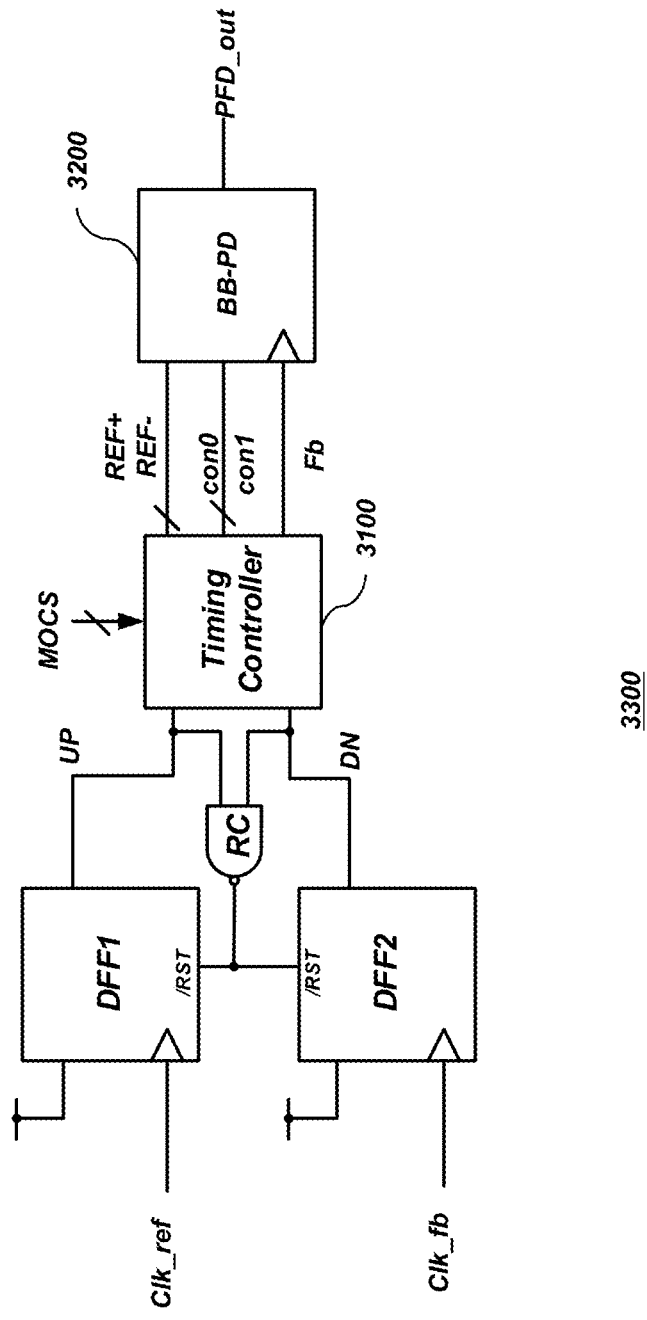
FIG. 10 is a block diagram of a BB-PFD of FIG. 9 in accordance with an embodiment.

FIG. 10 is a block diagram showing the BB-PFD 3300 of FIG. 9 in accordance with an embodiment. The BB-PFD 3300 includes a first flip-flop DFF1, a second flip-flop DFF2, a reset circuit RC, a timing controller 3100 and a BB-PD 3200.

The first flip-flop DFF1 latches the power supply voltage at the rising edges of the reference clock signal Clk_ref to output the first internal clock signal UP and the second flip-flop DFF2 latches the power supply voltage at the rising edges of the feedback clock signal Clk_fb to output the second internal clock signal DN.

The reset controller RC resets the first flip-flop DFF1 and the second flip-flop DFF2 when both the first internal clock signal UP and the second internal clock signal DN are high to make the first internal clock signal UP and the second internal clock signal DN be low.

Accordingly, pulse widths of the first internal clock signal UP and the second internal clock signal DN are determined by the phase difference between the reference clock signal Clk_ref and the feedback clock signal Clk_fb and the delay of the reset controller RC.

The timing controller 3100 outputs a third internal clock signals REF+ and REF− corresponding to the first internal clock signal UP and the fourth internal clock signal Fb corresponding to the second internal clock signal DN. The timing controller 3100 also outputs the control signal con by logically combining the modulation signal MOCS outputted from the sigma-delta modulator 110 and the second internal clock signal DN.

Figure 11:
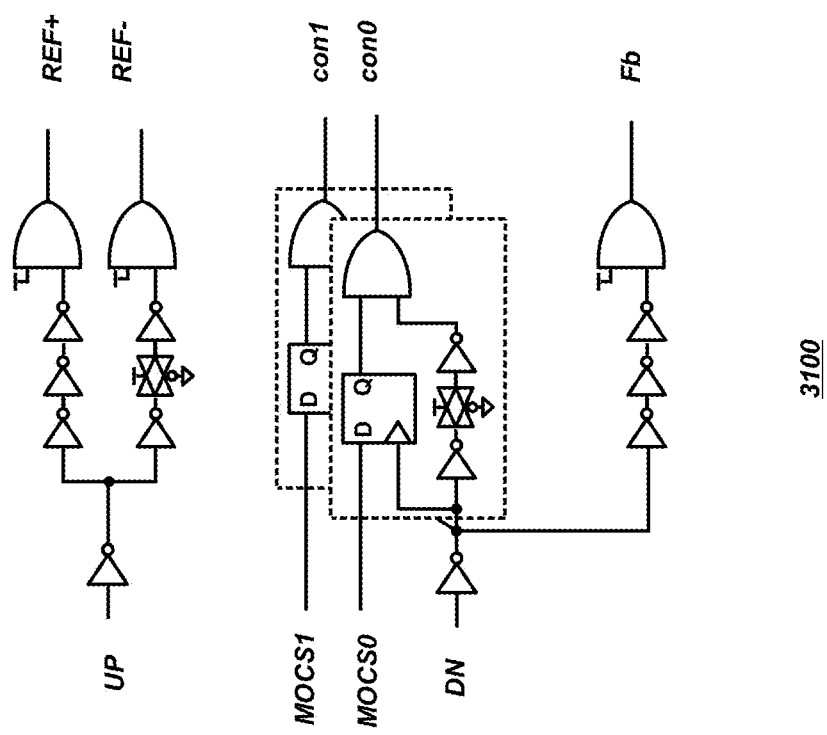
FIG. 11 is a circuit diagram of a timing controller of FIG. 10 in accordance with an embodiment.

FIG. 11 is a circuit diagram illustrating the timing controller 3100 of FIG. 10.

The timing controller 3100 generates the control signal con by latching the modulation signals MOCS0 and MOCS1 at the falling edges of the second internal clock signal DN. The control signals con0 and con1 become low when the second internal clock signal DN is high and the control signals con0 and con1 are set to have logic levels determined by modulation signals MOCS0 and MOCS1 when the second internal clock signal DN is low.

The third internal clock signals REF+ and REF− are generated by delaying the first internal signal UP and the fourth internal clock signal Fb is generated by delaying the second internal signal DN, where the amount of delay is determined by the time required for generating the control signals con0 and con1 from the modulation signals MOCS0 and MOCS1. Therefore, the timing controller 3100 may output the control signals con0 and con1 aligned with the fourth internal clock signal Fb.

Figure 12:
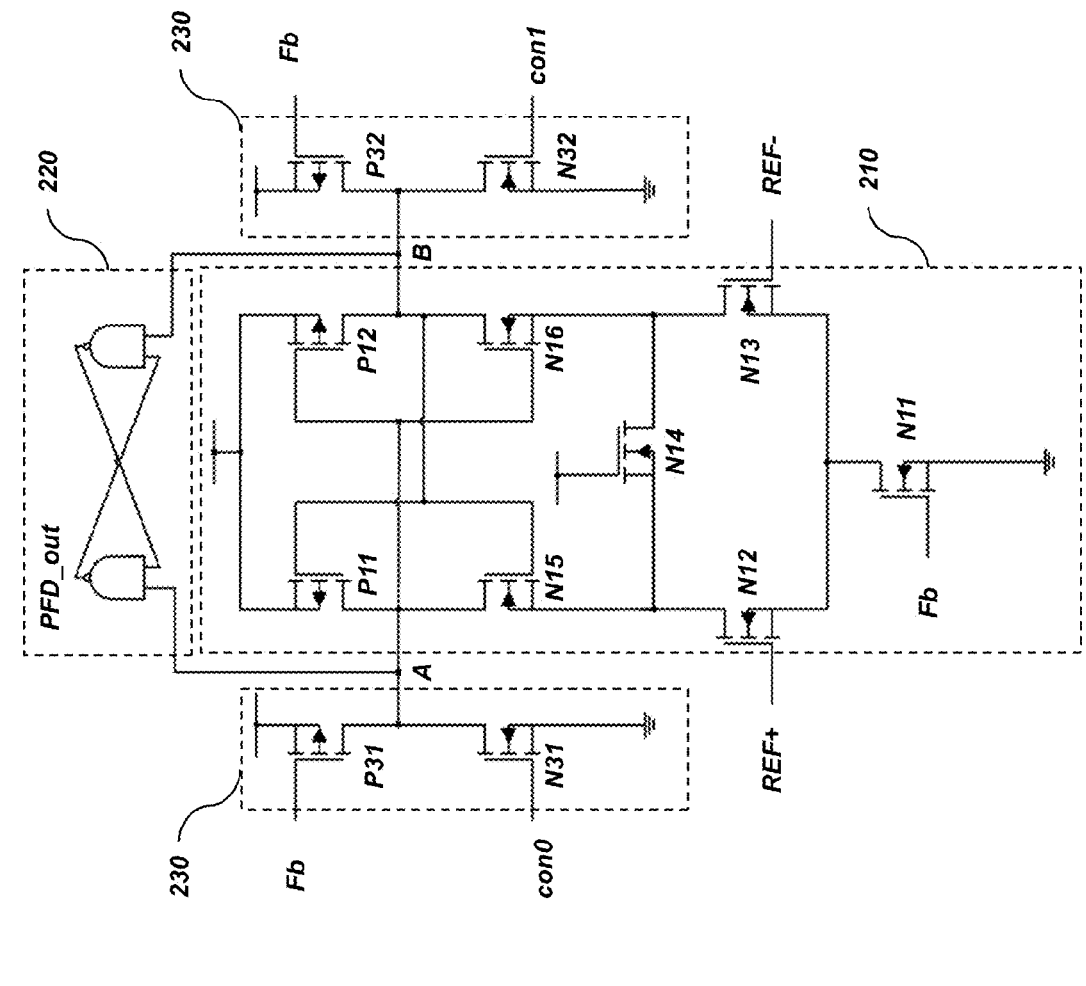
FIG. 12 is a circuit diagram of a BB-PD of FIG. 10 in accordance with an embodiment.

FIG. 12 is a circuit diagram of the BB-PD 3200 of FIG. 10. Since the circuit diagram shown in FIG. 12 is the same as the circuit diagram of FIG. 85 except that the names of input/output signals are changed to reflect the use of the BB-PD 3200 in the BB-PFD 3300, detailed description of FIG. 12 is omitted.

Figure 13:
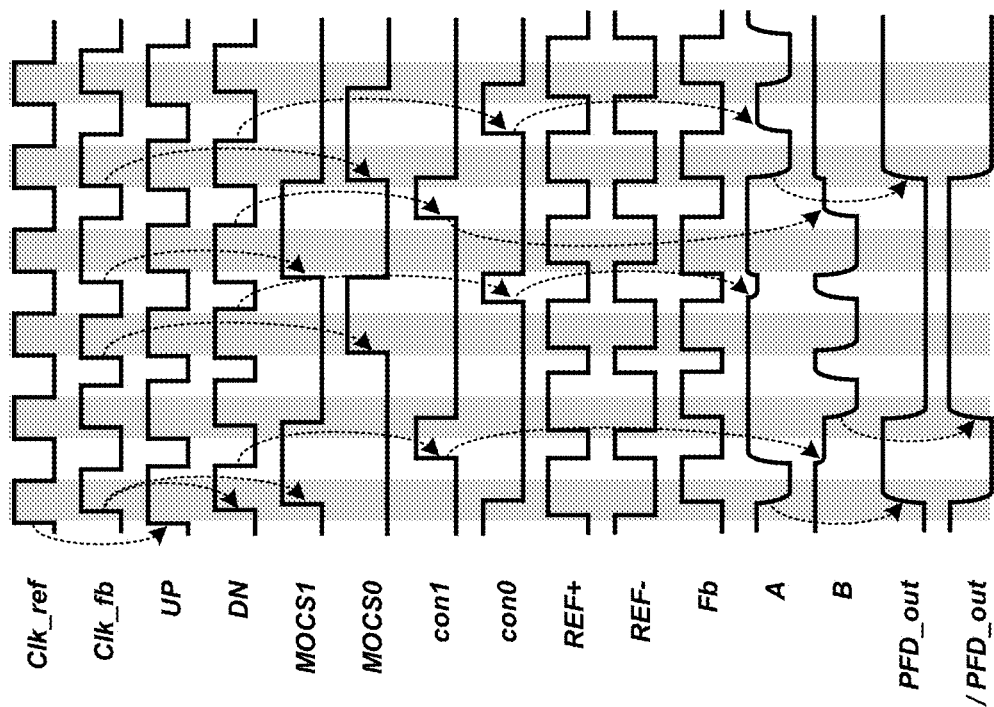
FIG. 13 is a timing diagram illustrating operations of a BB-PFD of FIG. 10 in accordance with an embodiment.

FIG. 13 is a timing diagram illustrating the operations of the BB-PFD 3300 of FIG. 10.

As illustrated the first internal clock signal UP is generated in synchronous with the reference clock signal Clk_ref and the modulation signal MOCS and the second internal clock signal DN are generated in synchronous with the feedback clock signal Clk_fb.

The control signals con0 and con1 are generated by latching the modulation signal MOCS at the falling edges of the second internal signal DN and the control signals con0 and con1 are set to be low when the second internal clock signal DN is high.

Since the third internal clock signal REF+ and REF− are generated by delaying the first internal clock signal UP and the fourth internal clock signal Fb is generated by delaying the second internal clock signal DN as long as the time required to generate the control signals con0 and con1, the control signals con0 and con1 are aligned with the fourth internal clock signal Fb.

When the fourth internal clock signal Fb is low, the control signals con0 and con1 controls the voltage dividing operation of the initial voltage control circuit 230 of FIG. 12 to determine the initial voltages of the first and second input terminals A and B.

When the fourth internal clock signal Fb is high, the control signals con0 and con1 become low and the current paths between the first and second input terminals A and B and power supply and ground nodes are cut off.

Then the phase comparing circuit 210 and the latch circuit 220 operate according to the third internal clock signals REF+ and REF− to generate the phase-frequency detection signal PFD_out.

The output timing of the phase-frequency detect signal PFD_out varies depending on the initial voltages of the first and the second input terminals A and B as well as on the phase difference between the third internal clock signal REF+ and the fourth internal clock signal Fb. As aforementioned, the initial voltages of the first and second input terminals A and B are determined by the control signals con0 and cont. In FIG. 13, there are three kinds of combinations of the control signals con0 and con1, which are "00", "01" and "10".

Figure 14A:
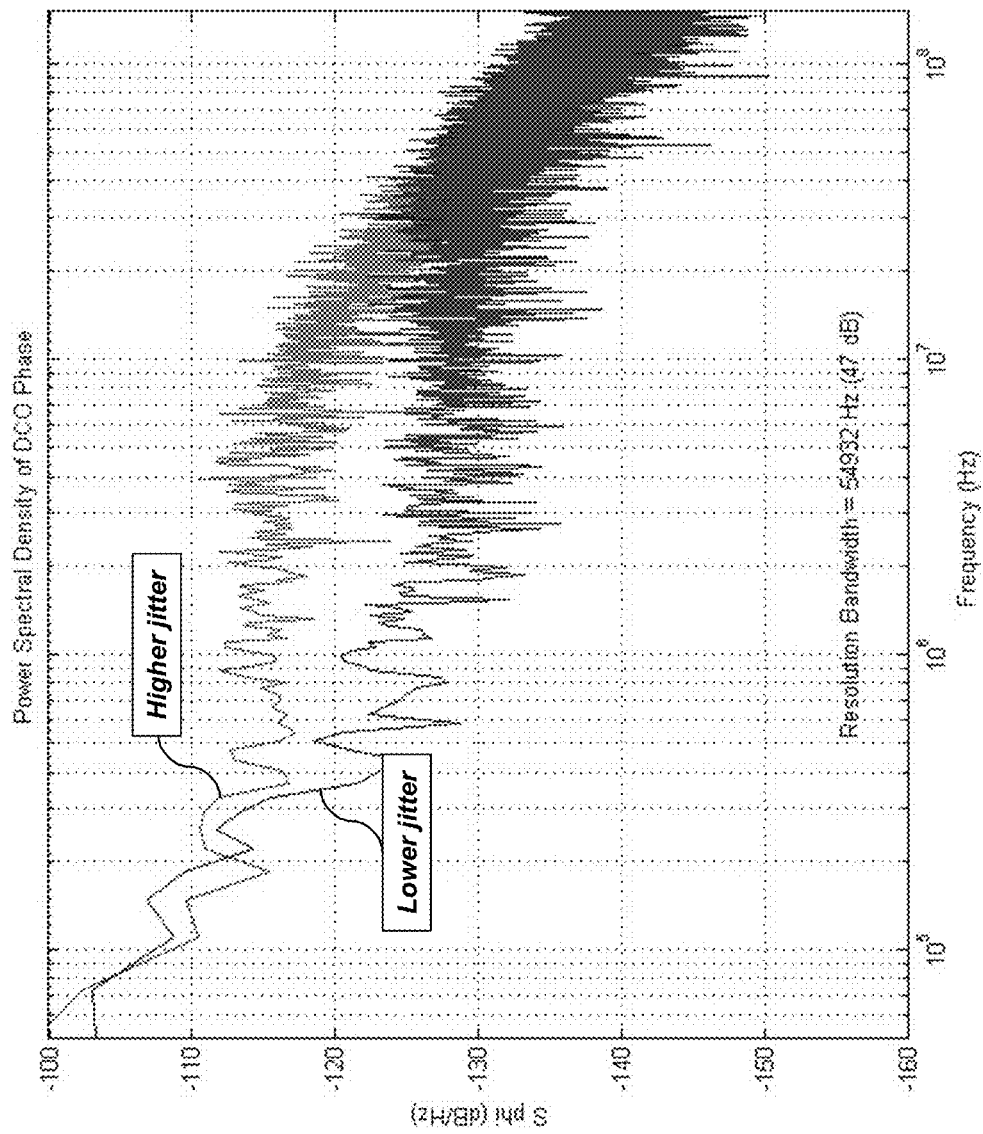
FIGS. 14a and 14b are graphs demonstrating the effects of embodiments of the present disclosure.
Figure 14B:
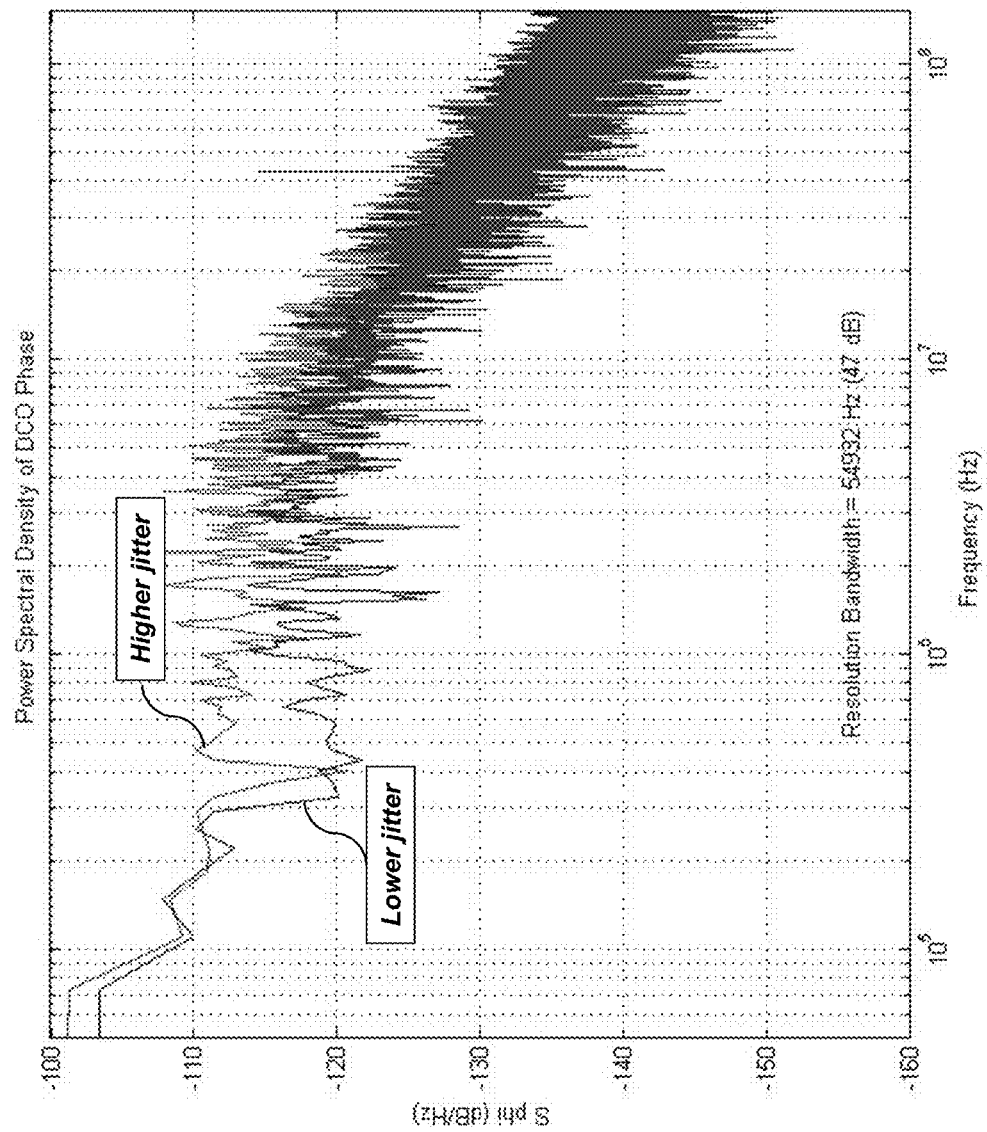

FIGS. 14a and 14b are graphs illustrating the effects of embodiments of the present disclosure. In the graphs, a dark gray line shows the case where relatively lower jitter is included in the reference clock signal Clk_ref, and a light gray line shows the case where relatively higher jitter is included in the reference clock signal Clk_ref.

FIG. 14a represents the case where the offset controller is not operating. In FIG. 14a, as the gain of the BB-PD is changed according to the jitter included in the reference clock signal Clk_ref, differences are caused in the gain and the bandwidth of the DPLL.

FIG. 14b represents the case where the offset controller 100 is operating. In FIG. 14b, it may be seen that the gain and the bandwidth of the DPLL are constantly retained regardless of the jitter included in the reference clock signal Clk_ref.

In particular, by randomly controlling the initial input voltage of the latch circuit 220 included in the BB-PD, the gain may be constantly retained without generating a peak within the bandwidth of the DPLL.

While certain embodiments have been described above, it will be understood to those skilled in the art that the embodiments described are by way of illustration only. Accordingly, the phase detector, the phase-frequency detector, and the digital phase locked is loop including the same described herein are not limited based on the described embodiments. Rather, the phase detector, the phase-frequency detector, and the digital phase locked loop including the same described herein are limited in light of the claims that follow when taken in conjunction with the above description and accompanying drawings.

What is claimed is:

1. A phase detector comprising:
   a phase comparing circuit configured to detect and output a phase difference between a first clock signal and a second clock signal;
   a latch circuit configured to latch an output signal of the phase comparing circuit and output a phase detection signal; and
   an initial voltage control circuit configured to variably control an initial voltage of an input terminal of the latch circuit by performing a voltage determining operation based on a control signal.

2. The phase detector according to claim 1, wherein the latch circuit comprises a first input terminal and a second input terminal, and
   wherein the initial voltage control circuit comprises a first voltage control subcircuit which controls the first input terminal and a second voltage control subcircuit which controls the second input terminal.

3. The phase detector according to claim 2, wherein the first voltage control subcircuit and the second voltage control subcircuit divide a power supply voltage in response to the control signal, and control initial voltages of the first input terminal and the second input terminal, respectively.

4. The phase detector according to claim 2, wherein the phase comparing circuit first discharges one of the first input terminal and the second input terminal according to the phase difference between the first clock signal and the second clock signal.

5. The phase detector according to claim 1, further comprising:
   an offset controller configured to output the control signal based on an offset control signal and the second clock signal.

6. The phase detector according to claim 5, wherein the offset controller comprises:
   a sigma-delta modulator configured to dither the offset control signal and output a modulation signal according to the second clock signal; and
   a decoder configured to decode the modulation signal and output the control signal according to the second clock signal.

7. A digital phase locked loop comprising:
   an offset controller configured to dither an offset control signal using a first clock signal and output a control signal;
   a phase detector configured to detect a phase difference between the first clock signal and a second clock signal according to the control signal and output a phase detection signal;
   a filter configured to filter the phase detection signal;
   a digital oscillator configured to generate a third clock signal based on an output of the filter, wherein an initial frequency of the third clock signal is controlled according to an initialization signal; and
   a feedback circuit configured to divide the third clock signal and generate the second clock signal.

8. The digital phase locked loop according to claim 7, wherein the phase detector comprises:
   a phase comparing circuit configured to detect and output a phase difference between the first clock signal and the second clock signal;
   a latch circuit configured to latch an output signal of the phase comparing circuit and output the phase detection signal; and
   an initial voltage control circuit configured to control an initial voltage of an input terminal of the latch circuit according to the control signal.

9. The digital phase locked loop according to claim 8, wherein the latch circuit comprises a first input terminal and a second input terminal, and
   wherein the initial voltage control circuit comprises a first voltage control subcircuit which controls an initial voltage of the first input terminal and a second voltage control subcircuit which controls an initial voltage of the second input terminal.

10. The digital phase locked loop according to claim 7, wherein the control signal is synchronous with the second clock signal.

11. The digital phase locked loop according to claim 10, wherein the offset controller comprises:
   a sigma-delta modulator configured to dither the offset control signal and output a modulation signal according to the second clock signal; and
   a decoder configured to decode the modulation signal and output the control signal according to the second clock signal.

12. A phase-frequency detector comprising:
   a first flip-flop configured to latch a power supply voltage according to a first clock signal and output a first internal clock signal;
   a second flip-flop configured to latch the power supply voltage according to a second clock signal and output a second internal clock signal;
   a reset circuit configured to logically combine the first internal clock signal and the second internal clock signal and generate a reset signal to reset the first flip-flop and the second flip-flop;
   a timing controller configured to generate a third internal clock signal by delaying the first internal clock signal, to generate a fourth internal clock signal by delaying the second internal clock signal and to generate a control signal by logically combining the external control signal where the control signal is aligned with the fourth internal clock signal; and
   a phase detector configured to detect a phase difference between the third internal clock signal and the fourth internal clock signal according to the control signal, and output a phase detection signal.

13. The phase-frequency detector according to claim 12, wherein the phase detector comprises:
   a phase comparing circuit configured to detect and output a phase difference between the third internal clock signal and the fourth internal clock signal;
   a latch circuit configured to latch an output signal of the phase comparing circuit and output the phase detection signal; and
   an initial voltage control circuit configured to control an initial voltage of an input terminal of the latch circuit according to the control signal.

14. The phase-frequency detector according to claim 13, wherein the latch circuit comprises a first input terminal and a second input terminal, and
   wherein the initial voltage control circuit comprises a first voltage control subcircuit which controls an initial voltage of the first input terminal and a second voltage control subcircuit which controls an initial voltage of the second input terminal.

15. The phase-frequency detector according to claim 13, wherein the phase comparing circuit first discharges one of the first input terminal and the second input terminal according to the phase difference between the third internal clock signal and the fourth internal clock signal.

16. The phase-frequency detector according to claim 12, further comprising:
   a sigma-delta modulator configured to dither an offset control signal and output the external control signal according to the second clock signal.

* * * * *